United States Patent
Woodbury et al.

(10) Patent No.: US 6,667,523 B2
(45) Date of Patent: Dec. 23, 2003

(54) HIGHLY LINEAR INTEGRATED RESISTIVE CONTACT

(75) Inventors: Dustin A. Woodbury, Indian Harbor Beach, FL (US); Joseph A. Czagas, Palm Bay, FL (US)

(73) Assignee: Intersil Americas Inc., Palm Bay, FL (US)

(*) Notice: Subject to any disclaimer, the term of this patent is extended or adjusted under 35 U.S.C. 154(b) by 29 days.

(21) Appl. No.: 10/121,412

(22) Filed: Apr. 12, 2002

(65) Prior Publication Data

US 2002/0109230 A1 Aug. 15, 2002

Related U.S. Application Data

(63) Continuation-in-part of application No. 09/339,274, filed on Jun. 23, 1999, now Pat. No. 6,403,472.

(51) Int. Cl.[7] .......................... H01L 29/76; H01L 47/00; H01L 29/12
(52) U.S. Cl. .......................... 257/382; 257/4; 257/379; 257/384; 257/536; 257/617; 257/914
(58) Field of Search ........................... 257/4, 379, 382, 257/383, 384, 390, 536, 617, 914

(56) References Cited

U.S. PATENT DOCUMENTS

| 4,700,465 A | 10/1987 | Sirkin ........................ 438/533 |
| 4,882,611 A | * 11/1989 | Blech et al. .................. 257/50 |
| 5,070,383 A | * 12/1991 | Sinar et al. .................. 257/537 |
| 5,232,865 A | * 8/1993 | Manning et al. ............. 438/382 |
| 5,331,197 A | * 7/1994 | Miyawaki et al. ........... 257/530 |
| 5,635,746 A | 6/1997 | Kimura et al. ............... 257/382 |
| 5,665,629 A | * 9/1997 | Chen et al. .................. 438/384 |
| 6,051,494 A | 4/2000 | Iwamatsu et al. ............ 438/683 |
| 6,146,934 A | * 11/2000 | Gardner et al. .............. 438/230 |

FOREIGN PATENT DOCUMENTS

| JP | 56060030 | | 5/1981 | |
| JP | 56147431 | | 11/1981 | |
| JP | 61061451 | | 3/1986 | |
| JP | 61-147581 | * | 7/1986 | ................. 257/51 |
| JP | 3-209818 | * | 9/1991 | ................. 438/527 |
| JP | 5183130 | * | 7/1993 | ................. 438/396 |
| JP | 06177145 | | 6/1994 | |

OTHER PUBLICATIONS

Wolf, "Silicon Processing from the VLSI Era vol. 2 Process Integration", Lattice Press, 1990, p. 128.

* cited by examiner

*Primary Examiner*—George Eckert
(74) *Attorney, Agent, or Firm*—Fogg and Associates, LLC; Scott V. Lundberg

(57) ABSTRACT

A semiconductor device or integrated circuit has high and low resistive contacts. Mobility spoiling ions such as carbon are implanted into all contacts of the substrate. High resistive contacts are temporarily covered with an oxide during processing to prevent silicide from forming due to interaction between a siliciding metal and the implanted mobility spoiling ions in the contacts. The resulting high resistance contacts have highly linear I-V curves, even at high voltages. Selective silicide formation converts some of the contacts back to low resistance contacts as a result of interaction between a siliciding metal and the implanted mobility spoiling ions in the low resistance contacts.

23 Claims, 3 Drawing Sheets

HIGHLY LINEAR INTEGRATED RESISTIVE CONTACT

CROSS-REFERENCE TO RELATED APPLICATIONS

This application is a Continuation-in-part (CIP) of U.S. application Ser. No. 09/339,274 filed Jun. 23, 1999 now U.S. Pat. No. 6,403,472.

FIELD OF THE INVENTION

This invention relates to the insertion of resistors in integrated-circuit memory or logic, specifically as related to semiconductor contacts.

BACKGROUND OF THE INVENTION

Resistors of high value (typically 1 k ohm) are often desired at many locations in a circuit. A typical application is the use of resistors in memory or logic to guard against single event upset phenomena in spacecraft and other applications. Typically such resistors are patterned from a high sheet resistance film. It would be advantageous to integrate a high value resistor into a semiconductor contact, thus avoiding the area penalty for using such resistors repetitively over the surface of the circuit.

Chen et al. (U.S. Pat. No. 5,665,629) explains the formation of a highly-resistive layer over contact openings using a CVD or physical deposition process, controlling the resistivity of the layer through control of the proportion of silicon in the deposition process, and subsequently performing a pattern mask and etch of the deposited material to remove selectively the deposited resistive layer.

Manning (U.S. Pat. Nos. 5,159,430 and 5,232,865) explains the formation of polysilicon-filled vias in contact with a silicon device and subsequently implanting oxygen or nitrogen to increase the resistance of the polysilicon plugs. A high-temperature anneal at about 950 C is carried out to stabilize the resistor value. Since load resistors are required only in some of the contacts, Manning's process involves fabricating the resistor contacts in a separate step, (i.e., two mask steps are required in order to fabricate all the contacts). An annealing temperature of 950° C. is high for very shallow doped devices, which can cause dopant spreading and affect junction widths. It is therefore preferable to form a high-value resistor using a lower-temperature process.

These prior-art methods teach the formation of a resistor by either introducing silicon in an $SiO_2$ layer or introducing oxygen or nitrogen into an Si layer, (i.e., by forming off-stoichiometric structures).

OBJECTIVES, AND ADVANTAGES

It is an object of the invention herein to simplify the prior art by selectively converting silicon substrate material located in a contact to a material with a desired higher resistivity, thereby eliminating the need to incorporate an added resistive layer.

It is an object of the invention herein to integrate a resistor with a metal interconnect.

It is another object of the invention herein to produce a high resistance contact having highly linear I-V characteristics over a wide range of voltage.

DETAILED DESCRIPTION OF THE DRAWINGS

SUMMARY OF THE INVENTION

The invention relates to a method for producing an article comprising a silicon substrate having mobility spoiling ions implanted in a portion thereof, thereby forming a stable and linear resistive contact.

The invention herein uses a low energy implantation technique to implant a mobility spoiling species such as carbon or oxygen directly in open contacts after the contacts have been cut. Subsequent steps selectively remove mobility spoiling ions from portions of the substrate in only some of the contacts, thereby creating the desired low resistance contacts. The mobility spoiling ions implanted in the remaining contacts are left in place to aid in producing the desired high resistance contacts. Consequently, no added resistive layers need be formed else where on or in the substrate using extra processing steps. Further, precision implant techniques preclude the need for high-temperature annealing.

The high resistance contacts formed in accordance with the invention herein exhibit a very high degree of linearity over a wide range of voltage that was previously unknown in the art of making resistive contacts.

DETAILED DESCRIPTION OF THE INVENTION

Figure 1A:
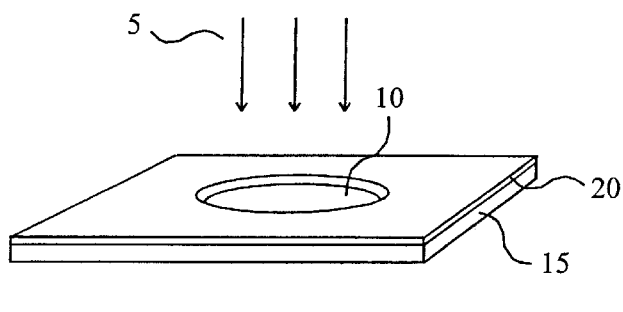
FIG. 1A shows an oblique view of a contact at the time of implant of the mobility spoiling material.
Figure 1B:
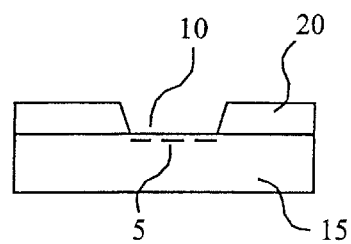
FIG. 1B shows a cross section of a contact after implant.

Referring to FIGS. 1A and 1B, a contact 10 is cut through a field dielectric 20 to expose a silicon substrate 15 below. A mobility spoiling ion species 5 is implanted through contact 10 into substrate 15, for all contacts on substrate 15. The presence of mobility spoiling ions in a material functions to inhibit a flow of electric current through a material. Consequently, the ion implanted material functions as a resistor.

Figure 2:
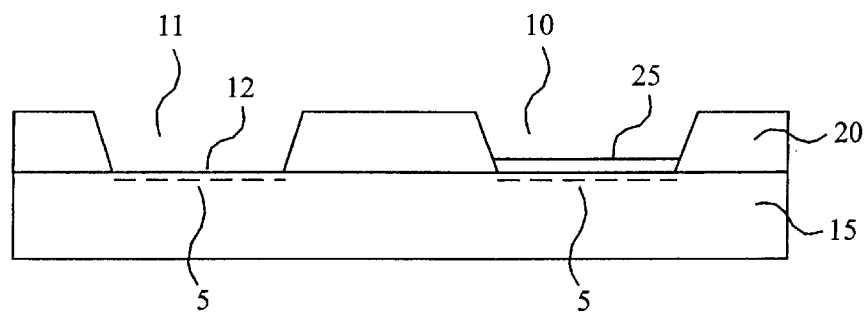
FIG. 2 shows the results of the selective etch (left contact) after the contact oxidation.

Referring to FIG. 2, an oxide 25 is grown or deposited on all contacts 10, 11. Selective etching then removes oxide 25 only from some contacts such as contact 11, leaving a surface 12 of substrate 15 exposed. Surface 12 contains the implanted ion species 5. Some contacts such as contact 10, retain oxide 25 after the selective etching process. Exposed contacts 11 will become low resistive contacts, and contacts 10 having oxide 25, will become high resistance contacts. The effect of this deposition and selective etching step is to differentiate high resistance contacts from low resistance contacts.

In one embodiment of the invention, oxide 25 is deposited in contacts 10 and 11 in lieu of using a grown oxide. This is because a grown oxide is efficient at removing implanted oxygen.

Consequently, a grown oxide would consume oxygen ions from contact 10 if the mobility spoiling species 5 are oxygen ions.

However, a grown oxide is not efficient at removing implanted carbon. Ergo, if the implanted mobility spoiling ions are carbon ions, then a grown oxide may be utilized as oxide 25, which is an alternate embodiment of the invention.

Figure 3:
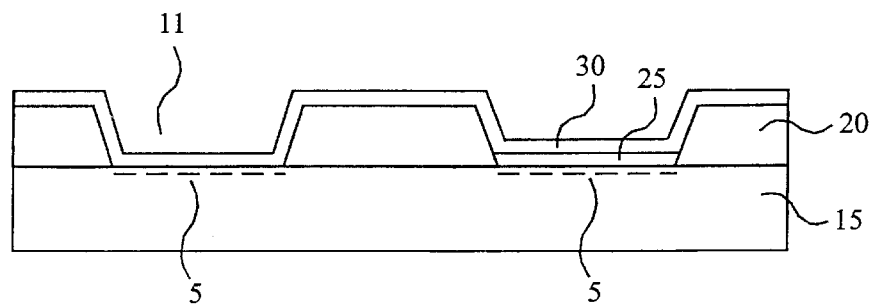
FIG. 3 shows the results after the deposition of a nonselective siliciding material.

Referring to FIG. 3, a nonselective siliciding metal 30 is then deposited and sintered to form a silicide 35 in selected low resistance contacts 11. Siliciding metal 30 and remaining oxide 25 (in contacts 10) are both stripped away. Siliciding metal 30 may be platinum, titanium, tungsten, or molybdenum. Other refractory metals may also be used.

Note high resistance contact 10 may be formed in a hexode etcher with a 100 to 200 volt bias in the presence of an organic photoresist.

Figure 4:
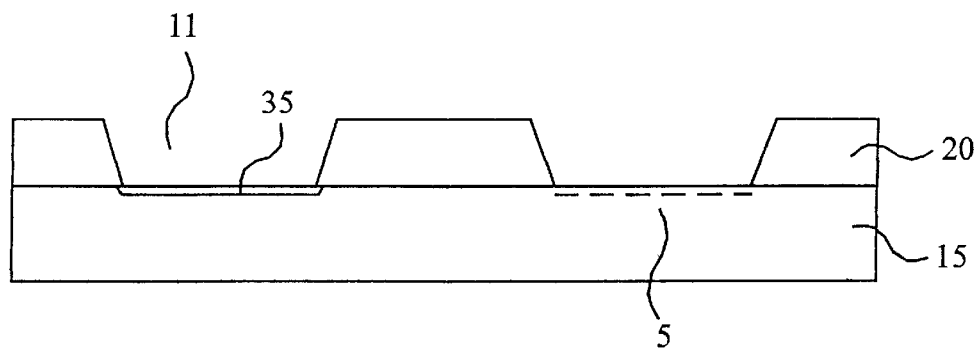
FIG. 4 shows the results after the stripping of the residual non-silicided metal and the contact oxide.

Referring to FIG. 4, contact 11 now contains a silicide 35, causing contact 11 to be a low resistance contact as desired.

Contact 10, having the mobility spoiling species has a higher resistance than contact 11.

A structural difference between contacts 11 and contacts 10 is that high resistance contact 10 is made without silicide so a metal, e.g. a barrier metal and/or an interconnect metal, rests directly on, and in direct contact with, the ion implanted portion of substrate 15 (silicon). This leaves the ion implanted silicon either actually or effectively undisturbed instead of being silicided.

Figure 5:
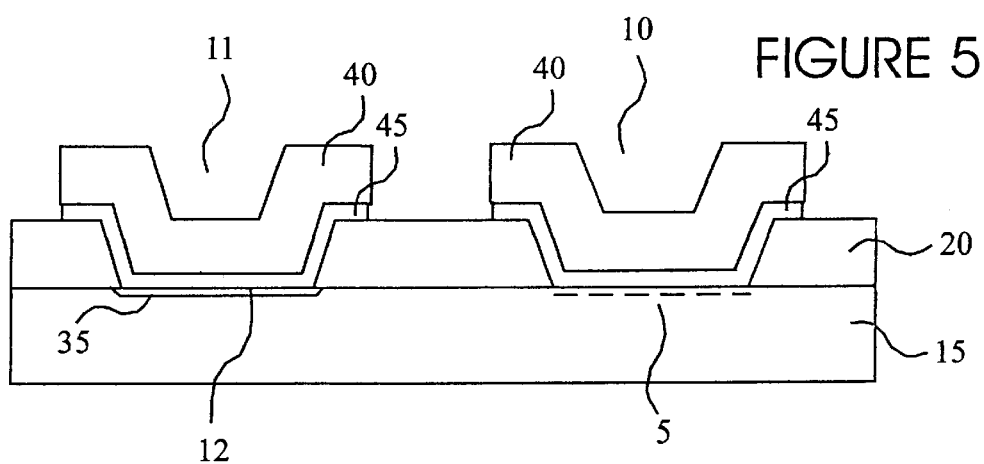
FIG. 5 shows the final metalization, with an interconnect metal in place on a barrier metal such as TiW which protects the contact from chemical interaction with the interconnect.

Referring to FIG. 5, a final metalization step or steps is/are performed, where an interconnect metal 40, comprising aluminum, is placed over a barrier metal 45. Barrier metal 45 protects contact surface 12 from interacting with interconnect metal 40. Barrier metal 45 is usually masked by interconnect metal 40 during a subsequent etch process. Barrier metal 45 can be W, TiW, or titanium nitride.

The original mobility spoiling ions implanted in substrate 15, through contact 11, are either actually or effectively, consumed by silicide 35 forming low resistance contact 11.

The original mobility spoiling ions implanted in substrate 15, through contact 10, either actually or effectively remain in substrate 15 (or may mix with barrier metal 45, or alternatively may mix with both barrier metal 45 and interconnect metal 40) thereby forming high resistance contact 10.

Figure 6:
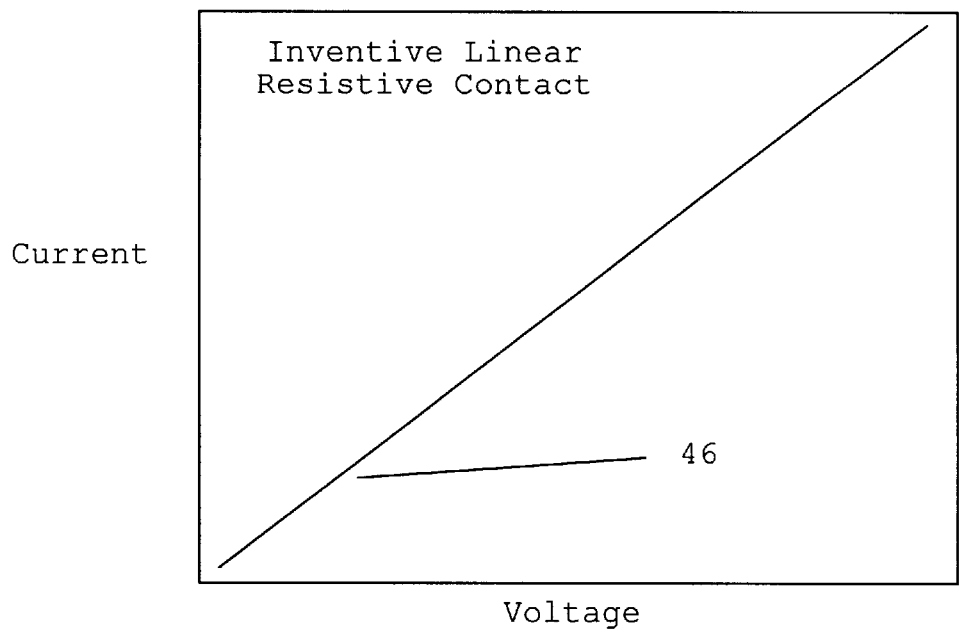
FIG. 6 shows a highly linear resistance characteristic of the invention herein.

Testing of high resistance contact 10 revealed an unexpected result of a very linear resistive contact that remained linear from 0 to about 175 v (the maximum voltage available from the curve tracer) as shown in FIG. 6. No indication of non-linear behavior was seen anywhere on I-V curve 46. In other words, curve 46 is a straight line over the entire range of voltage that high resistance contact 10 was tested, which means that the resistance is remaining constant. Attempts to break high resistance contact 10 down with high voltage, failed to "short" out or otherwise alter the highly linear characteristic of high resistance contact 10. This means that the value of resistance for contact 10 does not change versus voltage, a highly desired characteristic.

Figure 7:
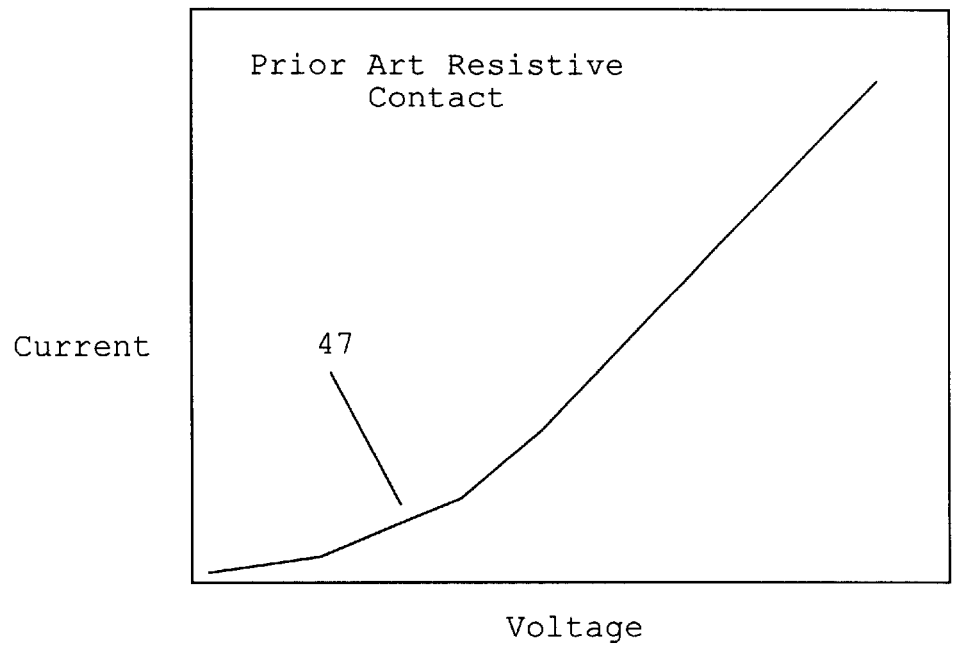
FIG. 7 shows a non-linear resistance characteristic of prior art resistors.

The I-V curve 47 for prior art resistive contacts is nonlinear, e.g. has a curved portion as shown in FIG. 7. The resistance of prior art resistive contacts starts to decrease as increasing voltage is applied. Further, the resistance of prior art resistive contacts changes over time with a given voltage applied, resulting in an unstable structure.

Consequently, prior art resistive contacts have not found widespread usage.

Since the inventive resistor herein is also very stable, and linear, it can be used as an integrated circuit element with high confidence that the I-V characteristic will not change during use. This allows for a significant reduction in semiconductor surface area since reliable resistors are now able to be integrated into contacts, thereby freeing up valuable "real estate". This in turn allows electronic devices to become smaller, or alternatively, new features may be added without increasing the size of the electronic device.

From the detailed description of the invention herein and the figures shown, some of the many advantages of the invention are clear:

1. The invention herein provides differentiation of low resistance contacts from high resistance contacts without requiring the formation of an added resistive layer,
2. precludes having to use valuable semiconductor surface area to form resistors,
3. reduces process integration issues, such as those associated with high-temperature annealing, as taught in Chen et al. (U.S. Pat. No. 5,665,629), and
4. provides a highly linear resistor over a wide range of voltage. In other words, the resistor formed in accordance with the invention herein has a resistance value that is constant versus voltage.

These and other advantages herein are applicable wherever the fundamental techniques are within the range of fabrication for all types of integrated circuits and/or semiconductor applications, including, but not limited to, digital, analog, RF and video.

Although the description and illustrative material here contain many specificities, these specificities should not be construed as limiting the scope of the invention but as merely providing illustrations and examples of some of the preferred embodiments of this invention. Thus the scope of the invention should be determined by the appended claims and their legal equivalents, rather than by the examples given above.

We claim:

1. An article comprising:
   at least one high resistance contact having some mobility spoiling ions implanted in a portion thereof, said mobility spoiling ions operative to inhibit a first electrical current flow;
   a plurality of low resistance contacts each having a silicide layer for enhancing a second electrical current flow;
   wherein all of said at least one high resistance contact, and all of said plurality of low resistance contacts were implanted with said mobility spoiling ions, and wherein said mobility spoiling ions in only said plurality of low resistance contacts are consumed by said silicide layer;
   wherein said all of at least one high resistance contact lack said silicide; and
   wherein an I-V curve of said high resistance contact is linear.

2. The article of claim 1 wherein said mobility spoiling ions are either oxygen or carbon.

3. The article of claim 2 further comprising a barrier layer integral to said at least one high resistance contact and said plurality of low resistance contacts, and wherein said barrier layer is a material selected from the group consisting of W, TiW, and TiN.

4. The article of claim 3 further comprising an interconnect metal forming an uppermost layer on top of said at least one high resistance contact and said plurality of low resistance contacts, and wherein said interconnect layer comprises aluminum.

5. The article of claim 4 wherein said silicide layer is a material selected from the group consisting of $TiSi_2$, $WSi_2$, $MoSi_2$, and $PtSi_2$.

6. The article of claim 1 wherein said I-V curve of said high resistance contact is linear over a voltage range of 0 to at least about 175 volts.

7. A semiconductor device or integrated circuit having at least one high resistance contact, said at least one high resistance contact comprising:

a first layer of silicon forming a substrate;

a first portion of said first layer of silicon having some mobility spoiling ions implanted in an upper surface thereof, said mobility spoiling ions operative to inhibit a first electrical current flow;

a second layer formed directly on, and in continuous contact with, at least a portion of said first portion of said first layer of silicon having some mobility spoiling ions implanted in an upper surface thereof;

a third layer formed directly on, and in continuous contact with said second layer, said third layer for providing an interconnection function;

wherein said second layer is operative to prevent interaction between said third layer and said first portion of said first layer of silicon having said some mobility spoiling ions implanted in said upper surface thereof;

wherein an I-V curve of said high resistance contact is linear over a voltage range of 0 to at least about 175 volts.

8. The semiconductor device or integrated circuit of claim 7 wherein said mobility spoiling ions are carbon.

9. The semiconductor device or integrated circuit of claim 7 wherein said mobility spoiling ions are oxygen.

10. The semiconductor device or integrated circuit of claim 8 wherein said second layer is a material selected from the group consisting of W, TiW, and TiN.

11. The semiconductor device or integrated circuit of claim 7 wherein said third layer comprises aluminum.

12. The semiconductor device or integrated circuit of claim 7 further comprising a plurality of low resistance contacts, each of said plurality of low resistance contacts containing a silicide layer operative to consume said mobility spoiling ions implanted in a second uppermost portion of said first layer of silicon.

13. The semiconductor device or integrated circuit of claim 12 wherein said silicide layer is a material selected from the group consisting of $TiSi_2$, $WSi_2$, $MoSi_2$, and $PtSi_2$.

14. A semiconductor device or integrated circuit comprising:

a plurality of low resistance contacts, wherein only said plurality of low resistance contacts have a silicide layer;

at least one high resistance contact, wherein only each of said at least one high resistance contact has a region containing mobility spoiling ions;

wherein said at least one high resistance contact is covered with a barrier layer for preventing said mobility spoiling ions from interacting with an interconnect layer comprising aluminum; and wherein an I-V curve of said high resistance contact is linear.

15. The semiconductor device or integrated circuit of claim 14 wherein said mobility spoiling ions are selected from the group consisting of carbon and oxygen.

16. The semiconductor device or integrated circuit of claim 14 wherein said I-V curve of said high resistance contact is linear over a voltage range of 0 to at least about 175 volts.

17. A computer or printed circuit board comprising:

a first layer of silicon forming a substrate;

a first portion of said first layer of silicon having some mobility spoiling ions implanted in an upper surface thereof, said mobility spoiling ions operative to inhibit a first electrical current flow;

a second layer formed directly on, and in continuous contact with at least a portion of said first portion of said first layer of silicon having some mobility spoiling ions implanted in an upper surface thereof; and wherein an I-V curve of said high resistance contact is linear over a voltage range of 0 to at least about 175 volts.

18. The computer or printed circuit board of claim 17 wherein said mobility spoiling ions are either oxygen or carbon.

19. The computer or printed circuit board of claim 18 wherein said second layer is a material selected from the group consisting of W, TiW, and TiN.

20. The computer or printed circuit board of claim 19 further comprising a third layer formed directly on, and in continuous contact with said second layer, said third layer for providing an interconnection function.

21. The computer or printed circuit board of claim 20 wherein said third layer comprises aluminum.

22. The computer or printed circuit board of claim 21 further comprising a plurality of low resistance contacts, each of said plurality of low resistance contacts containing a silicide layer operative to consume said mobility spoiling ions implanted in a second uppermost portion of said first layer of silicon.

23. The computer or printed circuit board of claim 22 wherein said silicide layer is a material selected from the group consisting of $TiSi_2$, $WSi_2$, $MoSi_2$, and $PtSi_2$.

* * * * *